(12) United States Patent
Richardson et al.

(10) Patent No.: US 9,100,041 B1
(45) Date of Patent: Aug. 4, 2015

(54) FLASH CONVERTER CAPACITANCE REDUCTION METHOD

(71) Applicant: Dialog Semiconductor GmbH, Kirchheim/Teck-Nabern (DE)

(72) Inventors: Justin Richardson, Edinburgh (GB); Mairead Kelly, Edinburgh (GB); Andrew Myles, Edinburgh (GB)

(73) Assignee: Dialog Semiconductor (UK) Limited, Reading (GB)

( * ) Notice: Subject to any disclaimer, the term of this patent is extended or adjusted under 35 U.S.C. 154(b) by 0 days.

(21) Appl. No.: 14/272,708

(22) Filed: May 8, 2014

(30) Foreign Application Priority Data

Apr. 30, 2014 (EP) .................................... 14368021

(51) Int. Cl.
*H03M 3/00* (2006.01)
(52) U.S. Cl.
CPC ................ *H03M 3/322* (2013.01); *H03M 3/30* (2013.01); *H03M 3/464* (2013.01)
(58) Field of Classification Search
CPC ........ H03M 3/30; H03M 3/322; H03M 3/464
USPC ........................................................ 341/143
See application file for complete search history.

(56) References Cited

U.S. PATENT DOCUMENTS

| | | | |
|---|---|---|---|
| 5,103,229 A | 4/1992 | Ribner | |
| 6,369,745 B1 * | 4/2002 | Lee et al. ...................... | 341/166 |
| 6,449,569 B1 * | 9/2002 | Melanson ....................... | 702/65 |
| 7,176,819 B1 * | 2/2007 | Swerlein et al. .............. | 341/143 |

FOREIGN PATENT DOCUMENTS

EP 1 480 342 11/2004

OTHER PUBLICATIONS

"A 1-V 140-μW 88-dB Audio Sigma-Delta Modulator in 90-nm CMOS," by Libin Yao et al., IEEE Journal of Solid-State Circuits, vol. 39, No. 11, Nov. 2004, pp. 1809-1818.
"Understanding Delta-Sigma Data Converters", by Richard Schreier et al., IEEE Press, Wiley-Interscience, A John Wiley & Sons, Inc., Publication, Copyright 2005, ISBN 0-471-46585-2, 1- Introduction, 3—The Second-Order Delta-Sigma Modulator, pp. 81 & 189.
European Search Report 14368021.3-1805, Dec. 5, 2014, Dialog Semiconductor GmbH.

* cited by examiner

*Primary Examiner* — Brian Young
(74) *Attorney, Agent, or Firm* — Saile Ackerman LLC; Stephen B. Ackerman; Billy Knowles

(57) ABSTRACT

A capacitance reduction circuit retains a conversion digital code of a previous sampling of an input signal of a delta-sigma modulated ADC and compares a set of least significant data bits and most significant bits of the conversion digital code to a least significant and a most significant boundary codes. When the least significant bits of the conversion digital code are less than or equal to the least significant boundary code or when the most significant bits of the conversion digital code are greater than or equal to the most significant boundary code, the capacitance reduction circuitry generates a capacitance reduction enable/disable code applied to multiple summation-quantization circuits to enable or disable groups of the multiple summation-quantization circuits bits to reduce capacitive loading of the outputs of delta-sigma modulator and an input signal to improve the total harmonic distortion and noise.

13 Claims, 10 Drawing Sheets

| Thermometer Feedback | ADC Binary Output | Remark |
|---|---|---|
| 000 0000 | 000 | Assume that upper bits are all low. |
| 000 0001 | 001 | LSB |
| 000 0011 | 010 | |
| 000 0111 | 011 | Idling, zero input state between codes 3 and 4. |
| 000 1111 | 100 | |
| 001 1111 | 101 | Assume that lower bits are all high. |
| 011 1111 | 110 | |
| 111 1111 | 111 | MSB |

FIG. 3

FLASH CONVERTER CAPACITANCE REDUCTION METHOD

TECHNICAL FIELD

This disclosure relates generally to multiple bit analog-to-digital converter circuits. More particularly, this disclosure relates to oversampled multiple bit flash analog-to-digital converter circuits. Even more particularly, this disclosure relates to circuits and methods for capacitance reduction within summation-quantization circuits within analog-to-digital converter circuits to improve total harmonic distortion of the analog-to-digital converter circuits.

BACKGROUND

As is known in the art, oversampling has become popular in recent years for converting signals between analog and digital formats. Oversampling avoids the difficulties encountered with conventional analog-to-digital and digital-to-analog (ADC, DAC) conversion techniques employing relatively low sampling rates, typically the Nyquist rate of the signal. Conventional analog-to-digital and digital-to-analog techniques require very precise analog components in the filter and conversion circuits because of their vulnerability to noise and interference.

Conversely, oversampling ADC or DAC's are able to use relatively simple high-tolerance components to achieve high resolution. By sampling at much higher frequencies than the Nyquist rate of the signal the difficulties of the conventional analog-to-digital and digital-to-analog techniques are avoided. Oversampling ADC or DAC's permit simple and relatively high-tolerance analog components to achieve high resolution. However, fast and complex digital signal processing techniques are required to implement the filtering of the aliasing frequencies in ADC's.

FIG. 1 is a schematic diagram of a delta-sigma modulated ADC of the related art. An analog input signal INa is applied to an amplifier A1. The output of the amplifier A1 is applied to one input of the summation circuit S1. The output of the summation circuit is a quantization error QERR that is applied to the Anti-Aliasing Filter AAF. The Anti-Aliasing Filter AAF is a composed of the cascaded integrators $f1, f2, f3$, and the buffers A1, A2, and A3. The Anti-Aliasing Filter AAF only processes the quantization noise of the analog-to-digital converter. The outputs of the buffers A1, A2, and A3 are applied to the summation circuit S2 to be additively combined with the input signal INa. The output of the summation circuit S2 is applied to the input of the flash quantizer FQ. The flash quantizer FQ is formed of multiple comparators COMP1, COMP2, . . . COMPn to generate the digital code. In this structure, the output digital code OUTB is a unary thermometer code that must be re-coded to a binary digital code in external circuitry. The output digital code OUTB is applied to the digital-to-analog converter DAC that converts the output digital code OUTB to an analog signal applied to the summation circuit S1. The output signal of the digital-to-analog converter DAC is subtractively combined to form a differential signal for determining the quantization error signal QERR.

The noise shaping of the Anti-Aliasing Filter AAF determines the spectrum of the quantization noise. The more severe the noise shaping that is chosen, the more pronounced the warping of the noise spectrum. This attenuates the quantization noise in the intended frequency band of interest, at the expense of increased higher frequency noise. A low pass decimation filter removes the high frequency noise, leaving only the filtered and decimated bandwidth of interest. However, the trade off is that the more high frequency the delta-sigma modulated ADC output OUTB contains, the less stable the input range becomes. Ideally the ADC would have a large stable input range in order to maximize signal to noise ratio (SNR), with a flat Total Harmonic Distortion and Noise (THDN) response up to or approaching that point. Once a delta-sigma modulated ADC's stable input range is exceeded, the response of the delta-sigma modulated ADC becomes badly degraded and can be unpredictable, worst case becoming permanently locked in oscillation even when a large input is removed.

Circuits and methods within the delta-sigma modulated ADC are needed to balance the trade off between maximizing the stable input voltage range with the choice of severity of noise shaping.

SUMMARY

An object of this disclosure is to provide a method and circuit for reducing total harmonic distortion and noise in a delta-sigma modulated ADC.

To accomplish at least this object, a delta-sigma modulated ADC has a capacitance reduction circuit that retains a conversion digital code of a previous sampling of an input signal of the delta-sigma modulated ADC and compares a set of least significant data bits and most significant bits of the conversion digital code to a least significant boundary code and a most significant boundary code. When the least significant bits of the conversion digital code are less than or equal to the least significant boundary code or when the most significant bits of the conversion digital code are greater than or equal to the most significant boundary code, the capacitance reduction circuitry generates a capacitance reduction enable/disable code applied to a quantization circuit. The quantization circuit receives the input signal and quantization error signal from a delta-sigma modulator of the delta-sigma modulated ADC, additively combines the input signal and the quantization error, and applies the combined quantizing signal to multiple comparators to generate a unary digital code representing a magnitude of the input signal. The summer enable/disable code gates a sampling clock applied to the quantization circuit. In some embodiments, the quantization circuit has a summation circuit with multiple switched capacitor summing circuits that sample the outputs of the delta-sigma modulator. Those of the multiple switched capacitor summing circuits designated for the least significant data bits and the most significant data bits of the unary digital code sample the quantizing signal when enabled or do not sample the quantizing signal when disabled. When selected switched capacitor summing circuits designated for least significant data bits and the most significant data bits of the unary digital code are not enabled, the capacitive loading of the outputs of one or more of the anti-aliasing filter, the multiple integrators of a modulator portion of the delta-sigma modulated ADC, and the input signal are reduced to improve the total harmonic distortion and noise.

In other embodiments, input signal and the quantization error are combined and filtered with a continuous time filter within the delta-sigma ADC. The quantizing circuit includes multiple dynamic comparators to which the quantizing signal is applied. Those of the multiple dynamic comparators designated for the least significant data bits and the most significant data bits of the unary digital code sample the quantizing signal when enabled or do not sample the quantizing signal when disabled. When selected dynamic comparators designated for least significant data bits and the most significant data bits of the unary digital code are not enabled, the capacitive loading of the outputs of the delta-sigma modulator are reduced to improve the total harmonic distortion and noise.

BRIEF DESCRIPTION OF THE DRAWINGS

FIG. 3 is a table detailing a unary thermometer code and a delta-sigma modulated ADC output binary code detailing which of the outputs of a switched-capacitance summation circuit and the flash quantizer are enabled or disabled by circuits and methods embodying the principles of the present disclosure.

DETAILED DESCRIPTION

Figure 1:
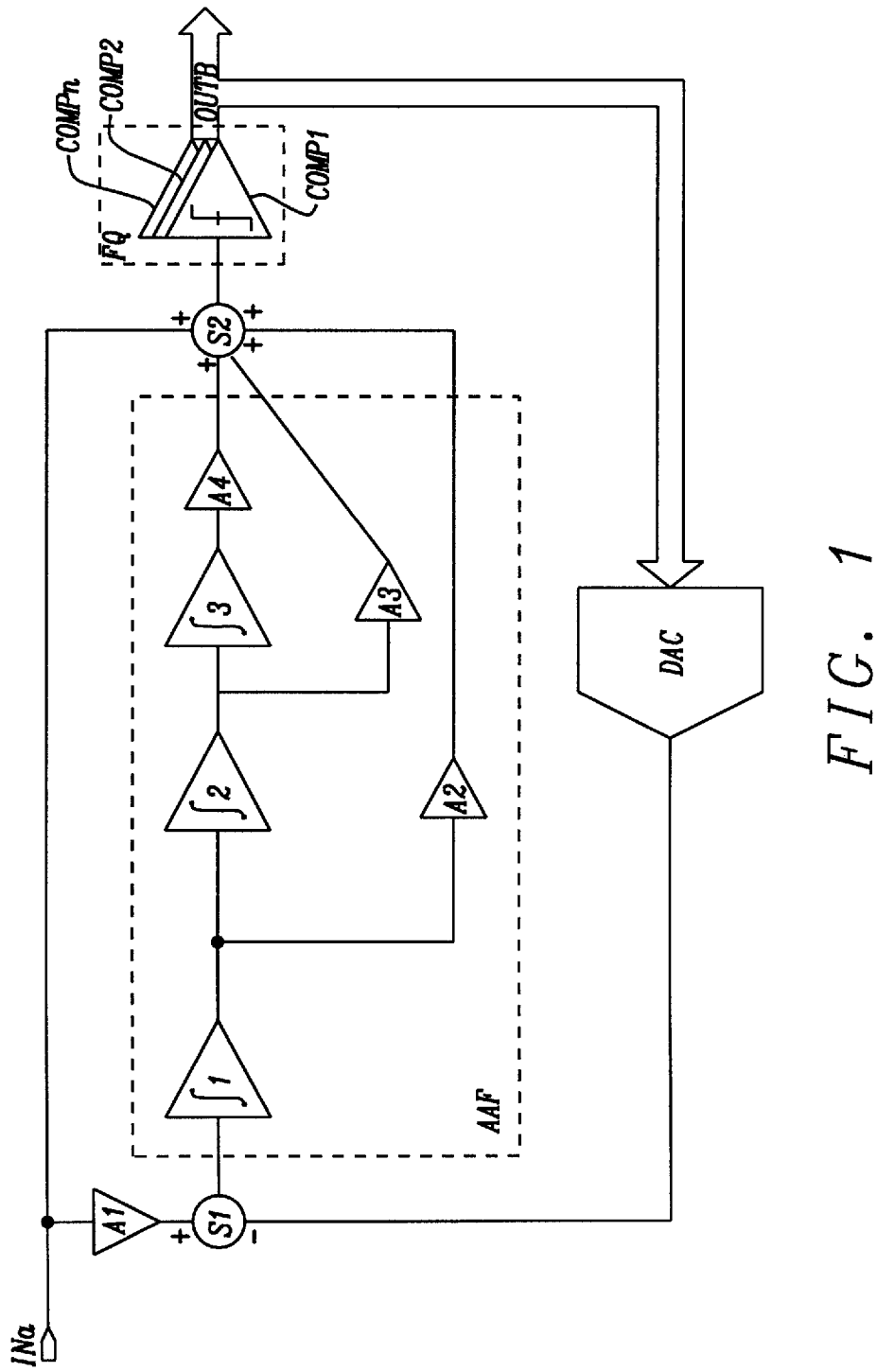
FIG. 1 is a schematic diagram of a delta-sigma modulated ADC.

The feed forward architecture of the delta-sigma modulated ADC of FIG. 1 is not sensitive to integrator linearity for total harmonic distortion performance. However, this means that particular attention is required to ensure a very accurate signal feed-forward path to the summation circuit S2.

When the delta-sigma modulated ADC of FIG. 1 is implemented as a discrete time (DT) analog-to-digital converter, an anti-aliasing filter AAF is also required in order to prevent sampling artifacts around sampling frequency (Fs) from being folded back into the first Nyquist zone or the region of the spectrum that is one-half the sampling frequency (Fs). Referring to FIG. 1, the anti-aliasing filter AAF includes the buffers A1, A2, and A3 that have to cope with both switching capacitance loads of the cascaded integrators $f1, f2, f3$, as well as the feed-forward path to the summer circuit S2. In various embodiments, the summation circuit S2 is formed of a switched capacitor sampling circuit that performs the combining process. Therefore the design of the anti-aliasing filter AAF becomes extremely important to the overall performance of the delta-sigma modulated ADC particularly when considering multi-bit structures.

In multiple bit delta-sigma modulated ADC's, the addition of a single bit to the delta-sigma modulated ADC output word doubles the capacitive load seen at the summation circuit S2. The doubling of the capacitive load results from the doubling of the number of summation-quantization elements in the summation circuit S2. The design of the input of the front-end summation circuit S1 becomes an larger challenge because the number of feedback elements is increased thus subdividing the summing caps into smaller unit elements causing a degraded mismatch at the summation circuit S1. With increased capacitive load on the anti-aliasing filter AAF, settling time is increased if the driving amplifier retains the same bandwidth and output drive capability for equal power consumption.

Figure 2:
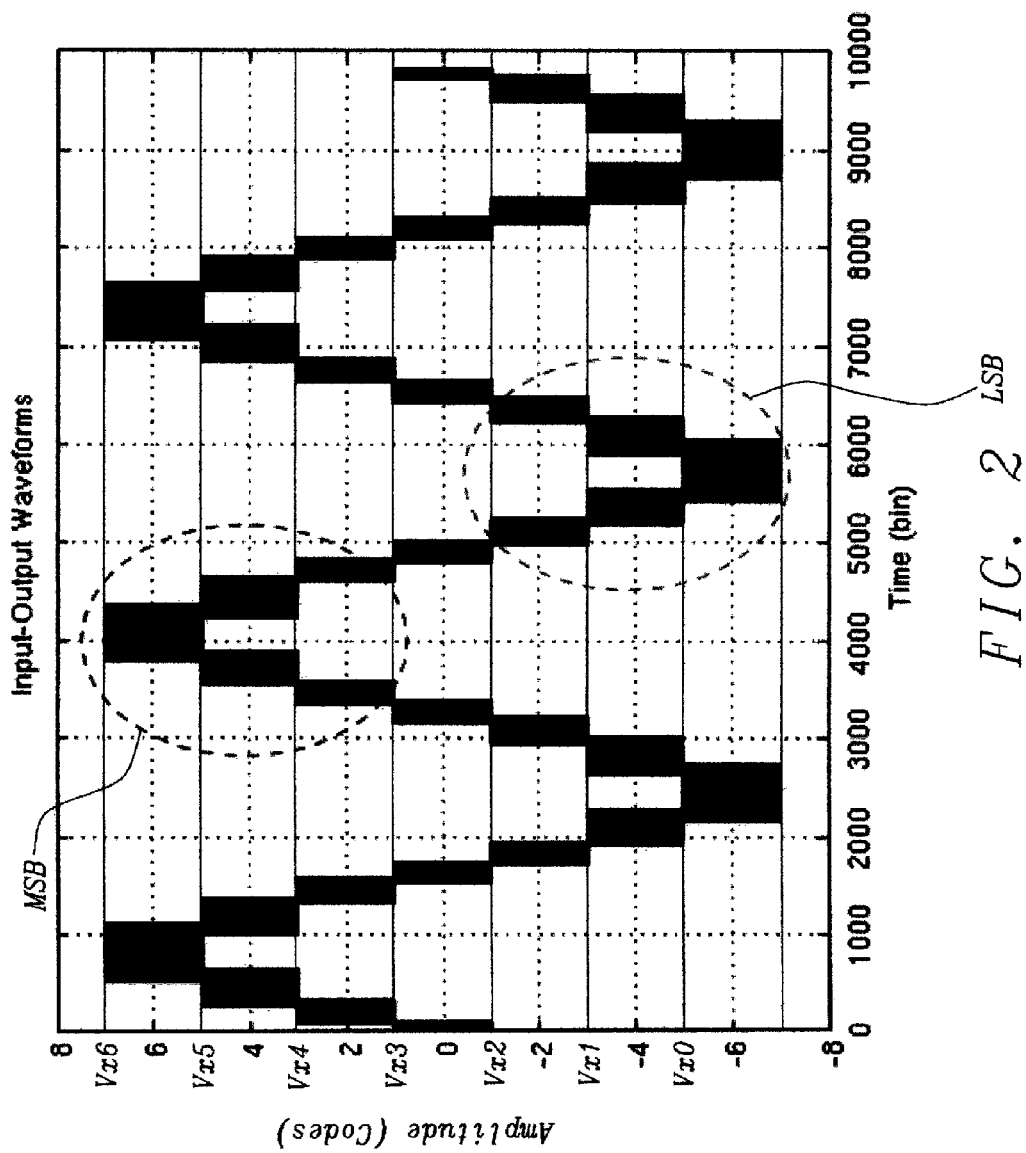
FIG. 2 is a diagram of a typical output waveform of a flash quantizer of a delta-sigma modulated ADC illustrating the comparator threshold voltages for each comparator to generate the unary coding that is encoded to the output digital code of the delta-sigma modulated. ADC.

FIG. 2 is a diagram of a typical output waveform of a flash quantizer of a delta-sigma modulated ADC illustrating the comparator threshold voltages for each comparator to generate the unary coding that is encoded to the output digital code of the delta-sigma modulated ADC. The waveform is structured as the 3 bit (8 level) digital code output OUTB of the multiple comparators COMP1, COMP2, . . . COMPn. The voltages Vmid1, Vmid2, . . . , Vmid6 are threshold voltage levels at which each of the multiple comparators COMP1, COMP2, . . . COMPn switches from a first logic level (0) to a second logic level (1). Each of the multiple comparators COMP1, COMP2, . . . COMPn represents one of the bits of the unary digital output code OUTB of the flash-quantizer FQ.

In a heavily oversampled system where the oversampling ratio is very large (i.e. 64 times the Audio Band Width) and having conservative out of band gain, the output OUTB of the flash quantizer FQ only transitions between adjacent codes. FIG. 3 is a table detailing a unary thermometer code and a delta-sigma modulated ADC output binary code detailing which of the outputs of a switched-capacitance summation circuit S2 and the flash quantizer FQ are enabled or disabled by circuits and methods embodying the principles of the present disclosure. The zones of the waveform of FIG. 2 and table of FIG. 3 having the highest magnitude are labeled MSB as having the least significant bits disabled and the most significant bits enabled. Alternately, the zones of the waveform of FIG. 2 and table of FIG. 3 having the lowest magnitude are labeled LSB as having the most significant bits all disabled and the least significant bits disabled.

In the zones labeled MSB and LSB it is reasonable to assume that the state of a defined number of the multiple comparators COMP1, COMP2, . . . COMPn of the flash quantizer FQ is constant, and therefore selected comparators of the multiple comparators COMP1, COMP2, . . . COMPn do not need to function at certain points of the conversion process, dependent on the input signal amplitude. This means that the switching capacitive load of the switched capacitor summation circuit S2 in the feed-forward path can be controlled and thus enhance the settling performance of the anti-aliasing filter AAF, when it is driving the switched-capacitance summation circuits S2 and the flash quantizers FQ with a high amplitude signal. The improved settling time permits improved total harmonic distortion and noise performance when the input signal Ina is nearing full scale.

In various embodiments of a delta-sigma modulated ADC, the circuit that performs the method for determining which of the switched-capacitance summation circuits S2 are enabled and disabled is implemented as an addition to a Data Weighted Averaging (DWA) circuit. In numerous embodiments, the normal thermometer to binary conversion provided in the Data Weighted Averaging circuit permits the generation of the enable and disable gating signals for control of the sampling clock activating and deactivating the switched-capacitance summation circuits S2.

Figure 4:
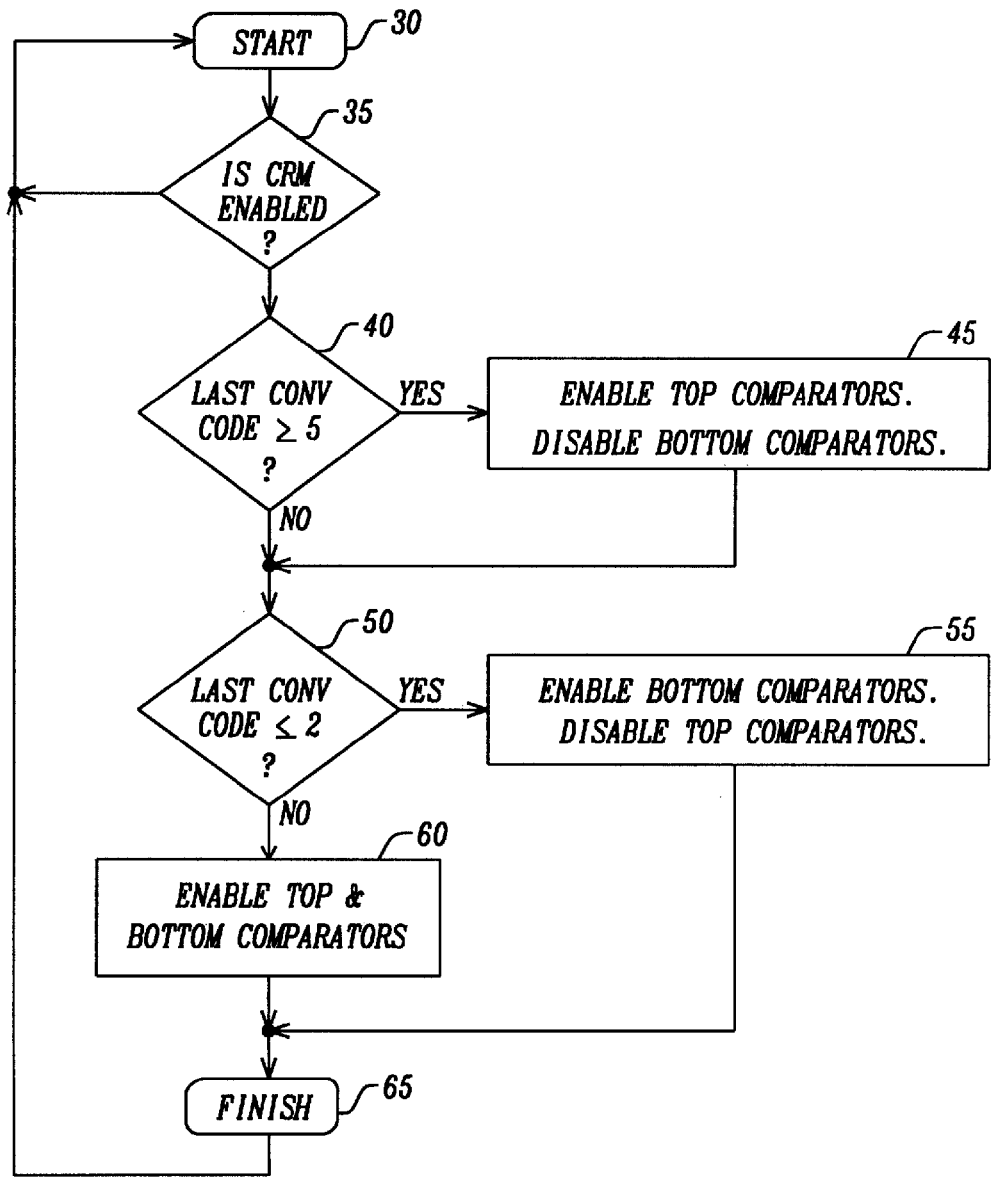
FIG. 4 is a flow chart diagram of a method implemented by a capacitance reduction circuitry within a delta-sigma modulated ADC.

FIG. 4 is a flow chart diagram of a method implemented by a capacitance reduction circuit within a delta-sigma modulated ADC. The capacitance reduction circuit within a delta-sigma modulated ADC of FIG. 6, as described hereinafter, executes the method as shown in FIG. 4. The method is started (Box 30) by examining (Box 35) a capacitance reduction mode signal to determine if the capacitance reduction mode (CRM) is enabled. If it is not enabled, the method cycles back to the starting of the method (Box 30) until the capacitance reduction mode is enabled. The previous thermometer code or the binary output code of the delta-sigma modulated ADC is examined (Box 40) to determine if the fifth bit of the thermometer code is set to a binary "1" or the three bit binary output code of the delta-sigma modulated ADC is equal to or greater than a binary "5" or "101". If the code is equal to or greater than the 5 value, the multiple quantizer comparators COMP1, COMP2, . . . COMPn of the most significant bits of the thermometer codes are enabled and the least significant bits are disabled (Box 45).

If the code is equal to or less than the 5 value or the multiple quantizer comparators COMP1, COMP2, . . . COMPn are appropriately enabled and disabled, the previous thermometer code or the binary output code of the delta-sigma modulated ADC is examined (Box 50) to determine if the third bit of the thermometer code is set to a binary "0" or the three bit binary output code of the delta-sigma modulated ADC is equal to or less than a binary "2" or "010". If the code is equal to or less than the 2 value, the multiple quantizer comparators COMP1, COMP2, . . . COMPn of the most significant bits of the thermometer codes are disabled and the least significant bits are enabled (Box 55). If the code is equal to or less than the 5 value, or equal to or greater than the 2 value, the most significant bits of the thermometer codes d and the least significant bits are enabled (Box 65). When the multiple quantizer comparators COMP1, COMP2, . . . COMPn are appropriately enabled and disabled, the operation is finished (Box 65).

Figure 5:
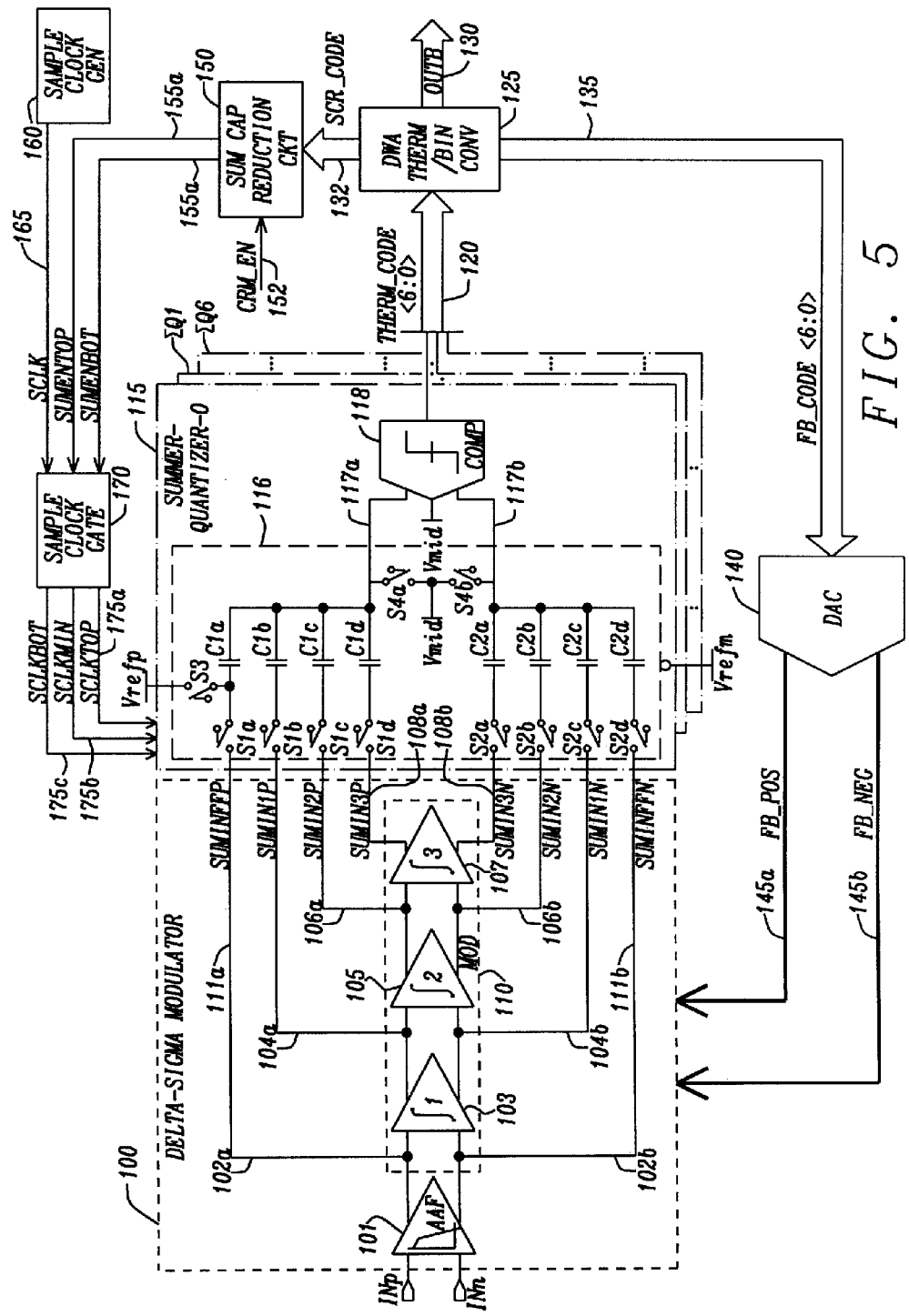
FIG. 5 is a schematic diagram of a delta-sigma modulated ADC including a capacitance reduction circuitry embodying the principles of the present disclosure.

FIG. 5 is a schematic diagram of a delta-sigma modulated ADC including capacitance reduction circuit 150 embodying the principles of the present disclosure. The audio input signals INp and INn are a differential audio signal transferred from an external audio source to the Delta-Sigma modulator 100. The audio input signals INp and INn are applied to the anti-aliasing filter 101 to attenuate or remove and higher frequency components of the audio input signals INp and INn. The output of the anti-aliasing filter 101 essentially forms the summation circuit to receive the feedback signals 145a and 145b for additively combining with the output signals of the anti-aliasing filter 101 to form the differential quantization error signals 102a and 102b. The differential quantization error signals 102a and 102b are applied to the first stage 103 of the modulator 110. The modulator 110 is a composed of the cascaded integrators 103, 105, 107. With the exception of being a differential structure, the cascaded integrators 103, 105, 107 are designed and function as the cascaded integrators ∫1, ∫2, ∫3 of FIG. 1. The outputs 104a and 104b of the first stage 103 of the modulator 110 are applied to the inputs of the second stage 105 of the modulator 110. Similarly, the outputs 106a and 106b of the second stage 105 of the modulator 110 are applied to the inputs of the third stage 107 of the modulator 110.

The feed-forward signals 111a and 111b are applied to the feed-forward inputs of the switched capacitor summation circuit 116 of the summation-quantization function 115. The output signals 104a and 104b of the first stage 103 of the modulator 110 are the first outputs of the delta-sigma modulator 100 and are applied as the first inputs to the switched capacitor summation circuit 116 of the summation-quantization function 115. The output signals 106a and 106b of the second stage 105 of the modulator 110 are the second anti-aliasing outputs of the delta-sigma modulator 100 and are applied as the second inputs to the switched capacitor summation circuit 116 of the summation-quantization function 115. The output signals 108a and 108b of the third stage 107 of the modulator 110 are the third anti-aliasing outputs of the delta-sigma modulator 100 and are applied as the third inputs to the switched capacitor summation circuit 116 of the summation-quantization function 115.

The summation-quantization function 115 is formed is composed of multiple summer-quantizer circuits $\Sigma Q0$, $\Sigma Q2, \ldots \Sigma Q6$. Each of the multiple summer-quantizer circuits $\Sigma Q0, \Sigma Q2, \ldots \Sigma Q6$ is assembled of the switched capacitor summation circuit 116 and the quantization comparator circuit 118. The switched capacitor summation circuit 116 has two banks of four switches S1a, S1b, S1c, and S1d and S2a, S2b, and S2c, and S2d. Each switch of the first bank of four switches S1a, S1b, S1c, and S1d has a first terminal connected to receive a positive phase of the feed-forward signals 111a and 111b and the first output signals 104a and 104b, second output signals 106a and 106b, and third output signals 108a and 108b to the switched capacitor summation circuit 116. The second terminals of the first bank of four switches S1a, S1b, S1c, and S1d are respectively connected to a first terminal of one capacitor of the first bank of capacitors C1a, C1b, C1c, and C1d. The second terminals of each capacitor of the first bank of capacitors C1a, C1b, C1c, and C1d are commonly connected and applied to a positive input terminal 117a of the quantization comparator circuit 118. Each switch of the second bank of four switches S2a, S2b, S2c, and S2d has a first terminal connected to receive a negative phase of the feed-forward signals 111a and 111b and the first output signals 104a and 104b, second output signals 106a and 106b, and third output signals 108a and 108b to the switched capacitor summation circuit 116. The second terminals of the second bank of four switches S2a, S2b, S2c, and S2d are respectively connected to a first terminal of one capacitor of the second bank of capacitors C2a, C2b, C2c, and C2d. The second terminals of each capacitor of the second bank of capacitors C2a, C2b, C2c, and C2d are commonly connected and applied to a negative input terminal 117b of the quantization comparator circuit 118.

Each of the switches of the two banks of four switches S1a, S1b, S1c, and S1d and S2a, S2b, and S2c, and S2d has a control terminal connected to receive a sampling clock to activate and deactivate the two banks of four switches S1a, S1b, S1c, and S1d and S2a, S2b, and S2c, and S2d at the sampling rate to apply the feed-forward signals 111a and 111b and the first output signals 104a and 104b, second output signals 106a and 106b, and third output signals 108a and 108b to the first terminal of their respectively connected capacitors C1a, C1b, C1c, and C1d, and C2a, C2b, C2c, and C2d. The voltages present at the positive input terminal 117a and negative input terminal 117b resulting from the sampling of the feed-forward signals 111a and 111b and the first output signals 104a and 104b, second output signals 106a and 106b, and third output signals 108a and 108b are compared to the comparison voltage Vmid. The quantization comparator 118 will change state depending on the voltage level of the comparison of the summation of samplings of the feed-forward signals 111a and 111b and the first output signals 104a and 104b, second output signals 106a and 106b, and third output signals 108a and 108b. In various embodiments, the delta-sigma modulated ADC will have a number of summation-quantization functions 115 equal to the number of bits in a unary thermometer code used for determining an amplitude of the differential audio input signal INp and INn.

In a time between each of the sampling clocks, the switch S3 is activated to connect the first terminal of the capacitor C1a to positive reference power supply voltage source Vrefp. Similarly, switches S4a and S4b are activated to connect the second terminals of the capacitors C1a, C1b, C1c, and C1d, and C2a, C2b, C2c, and C2d are connected to the positive reference power supply voltage source Vrefp.

The output of each of the quantization comparators 118 of the multiple summer-quantizer circuits ΣQ0, ΣQ2, . . . ΣQ6 is a designated binary bit of the thermometer code 120. The thermometer code 120 is applied to a data weighted averaging thermometer-to-binary converter 125. The data weighted averaging thermometer-to-binary converter 125 recodes the thermometer code 120 to a binary output code 130 and a dynamic element matching of the quantization comparator 118 using a data weighted averaging method to linearize a feedback code 135 that is applied to the feedback digital-to-analog converter (DAC) 140. The feedback DAC 140 generates the differential analog feedback signals 145a and 145b that are applied to the delta-sigma modulator 100 to be subtractively combined with the output of the anti-aliasing filter 101 to form the differential quantization error signals 102a and 102b.

The data weighted averaging thermometer-to-binary converter 125 transfers a capacitance reduction code 132 to a capacitance reduction circuit 150. A capacitance reduction enable signal 152 activates or deactivates the capacitance reduction circuit 150 to generate the enable and disable signals 155a and 155b to enable the switched capacitor summation circuits 116 for quantization comparator 118 generating the most significant bits and least significant bits of the thermometer code 120. As described above, the selective enabling and disabling of the switched capacitor summation circuits 116 improves settling time of the delta-sigma modulator 100 and thus permits improved total harmonic distortion and noise performance when the input signals INp and INn are nearing full scale.

The top enabling signal 155a and the bottom enabling signal 155b are applied to a sample clock gating circuit 170. The sample clock generator 160 generates the base sample clock 165 that is applied to the sample clock gating circuit 170. The sample clock gating circuit 170 gates the top or most significant bits of the summation-quantization function 115 or the bottom or least significant bits of the summation-quantization 115 by enabling or disabling the sampling clocks 175a and 175c. The middle sampling clock 175b is essentially the ungated sampling clock transferred at its appropriate time periods with no gating function.

Figure 6A:
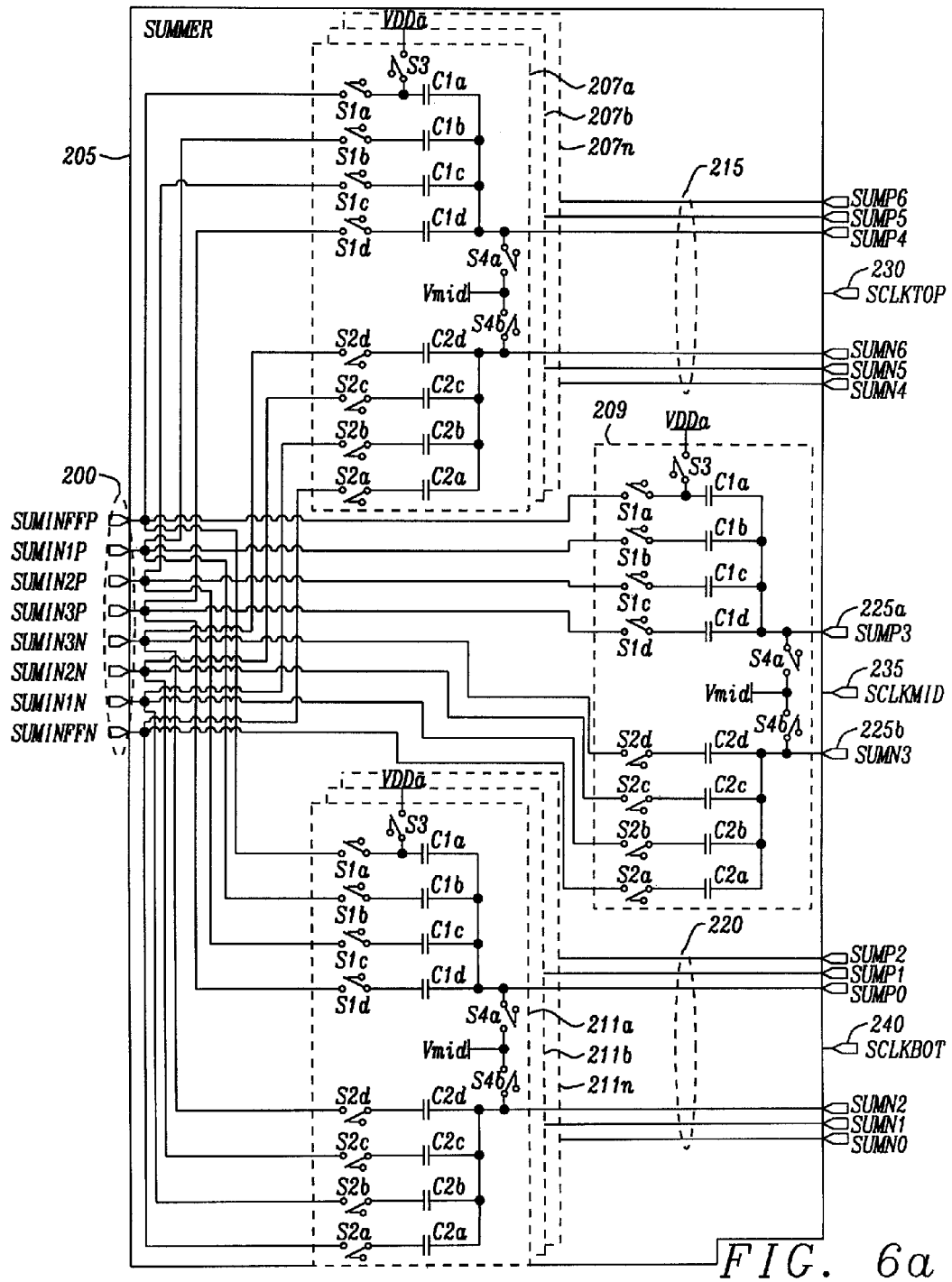
FIGS. 6a and 6b are a schematic diagram of a summation-quantization and capacitance reduction circuitry within a delta-sigma modulated ADC embodying the principles of the present disclosure.
Figure 6B:
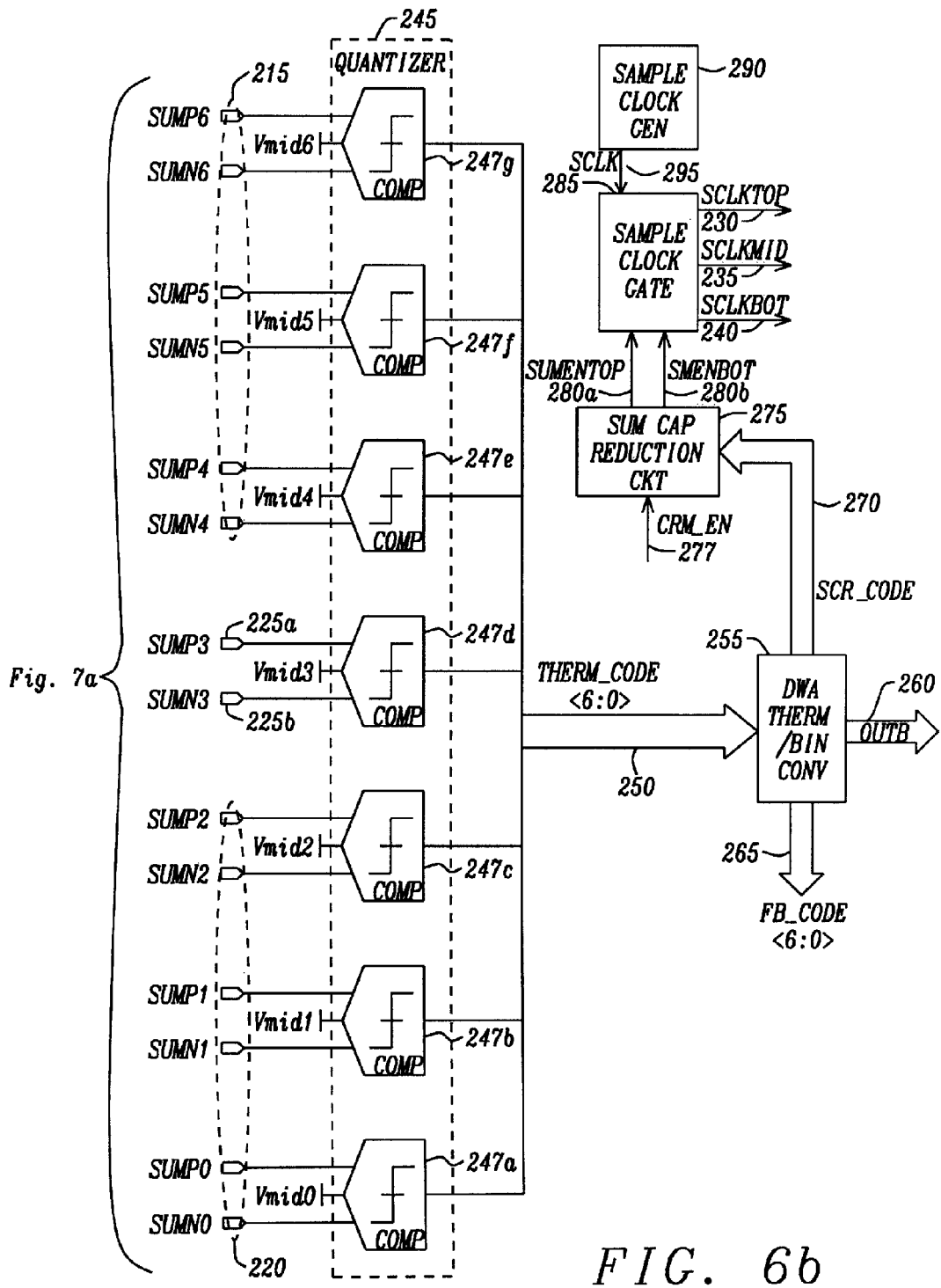
Figure 6C:
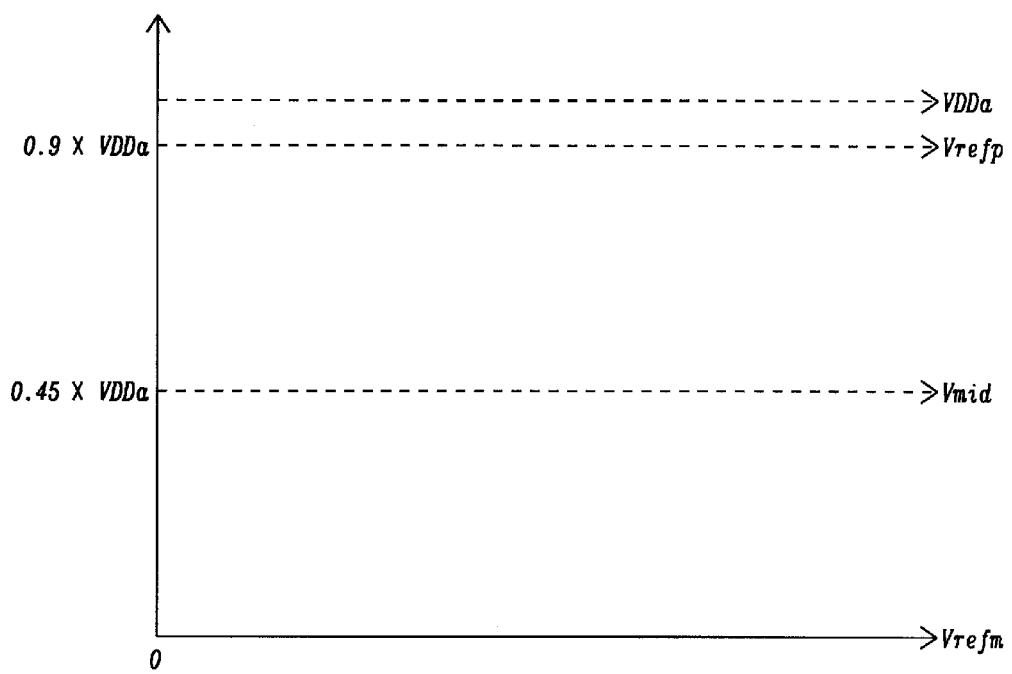
FIG. 6c is a plot of the positive and negative voltage reference levels, and the mid-range voltage level as compared to the analog power supply voltage source of the summation-quantization and capacitance reduction circuitry within a delta-sigma modulated ADC embodying the principles of the present disclosure.

FIGS. 6a and 6b are a schematic diagram of a summation-quantization and capacitance reduction circuitry within a delta-sigma modulated ADC embodying the principles of the present disclosure. FIG. 6c is a plot of the positive and negative voltage reference levels Vrefp and Vrefm, and the mid-range voltage level Vrefm as compared to the analog power supply voltage source VDDa of the summation-quantization and capacitance reduction circuitry 275 of FIG. 275 within a delta-sigma modulated ADC of FIG. 5 embodying the principles of the present disclosure. The positive voltage reference levels Vrefp is approximately 90% of the voltage level of the analog power supply voltage source VDDa and the negative voltage reference level Vrefm approximately equal to the voltage level of the ground reference voltage level (0V). The mid-range voltage level Vrefm is approximately 45% of the voltage level the analog power supply voltage source VDDa.

FIG. 6a illustrates the summer function 205 that receives the output signals 200 of the delta-sigma modulator 100 of FIG. 5 that are the feed-forward signals 111a and 111b and the first output signals 104a and 104b, second output signals 106a and 106b, and third output signals 108a and 108b of the delta-sigma modulator 100 of FIG. 5. The summer function 205 includes the switched capacitor summation circuits 207a, 207b, and 207c, 209, and 211a, 211b, and 211c. Each of the switched capacitor summation circuits 207a, 207b, and 207c, 209, and 211a, 211b, and 211c is structured and functions as described for the switched capacitor summation circuit 116 of FIG. 5.

The switched capacitor summation circuits 207a, 207b, and 207c each provide the summation signals 215 created by additively combining the output signals 200 of the delta-sigma modulator 100 that are to be used to determine the most significant bits of the thermometer code 250. The switched capacitor summation circuit 209 provides the summation signals 225a and 225b created by additively combining the output signals 200 of the delta-sigma modulator 100 that are to be used to determine the middle bit of the thermometer code 250. It should be noted that while a single switched capacitor summation circuit 209 is shown, it is in keeping with the principles embodying this disclosure that any number of the switched capacitor summation circuits may be used for creating the summation signals created by additively combining the output signals 200 of the delta-sigma modulator 100 that are to be used to determine the middle bit or bits of the thermometer code 250. The switched capacitor summation circuits 211a, 211b, and 211c each provide the summation signals 220 created by additively combining the output signals 200 of the delta-sigma modulator 100 that are to be used to determine the least significant bits of the thermometer code 250.

The summation signals 215, 225a, 225b, and 220 are applied to the quantizer 245. The quantizer 245 is formed of the quantization comparators 247a, 247b, . . . 247g. The quantization comparators 247e, 247f, and 247g receive the differential summation signals 215. The quantization comparator 247d receives the differential summation signals 225a and 225b. The quantization comparators 247a, 247b, and 247c receive the differential summation signals 220. The threshold voltages Vx0, Vx1, . . . Vx6 determine respectively when the input voltage level of the summation signals 215, 225a, 225b, and 220 are greater than or less than the threshold voltages Vx0, Vx1, . . . Vx6. This establishes the unary thermometer code 250 that is the combined outputs of the quantization comparators 247a, 247b, . . . 247g and thus the output signal of the quantizer 245.

The thermometer code 250 is applied to a data weighted averaging thermometer-to-binary converter 255 similar to that described in FIG. 5. The data weighted averaging thermometer-to-binary converter 255 recodes the thermometer code 250 to a binary output code 260 and a dynamic element matching of the quantization comparators 247e, 247f, and 247g using a data weighted averaging method to linearize a feedback code 265 that is applied to a feedback DAC similar to the feedback DAC 140 of FIG. 5.

The data weighted averaging thermometer-to-binary converter 255 transfers a capacitance reduction code 270 to a capacitance reduction circuit 275. A capacitance reduction method enable signal 277 activates or deactivates the capacitance reduction circuit 275 to generate the enable and disable signals 280a and 280b to enable one or more of the switched capacitor summation circuits 207a, 207b, and 207c, and 211a, 211b, and 211c for quantization comparators 247e, 247f, and 247g and quantization comparators 247a, 247b, and 247c generating the most significant bits and least significant bits of the thermometer code 250. As described above, the selective enabling and disabling of one or more of the switched capacitor summation circuits 207a, 207b, and 207c, and 211a, 211b, and 211c improves settling time of the delta-sigma modulator 100 of FIG. 5 and thus permits improved total harmonic distortion and noise performance when the input signals INp and INn of FIG. 5 are nearing full scale.

The top enabling signal 280a and the bottom enabling signal 280b are applied to a sample clock gating circuit 285. The sample clock generator 290 generates the base sample clock 295 that is applied to the sample clock gating circuit 285. The sample clock gating circuit 285 gates the top or most significant bits of the summer quantizer 245 or the bottom or least significant bits of the summation-quantization 245 by enabling or disabling the sampling clocks 230 and 240. The middle sampling clock 235 is essentially the sampling clock transferred at its appropriate time periods.

Figure 7:
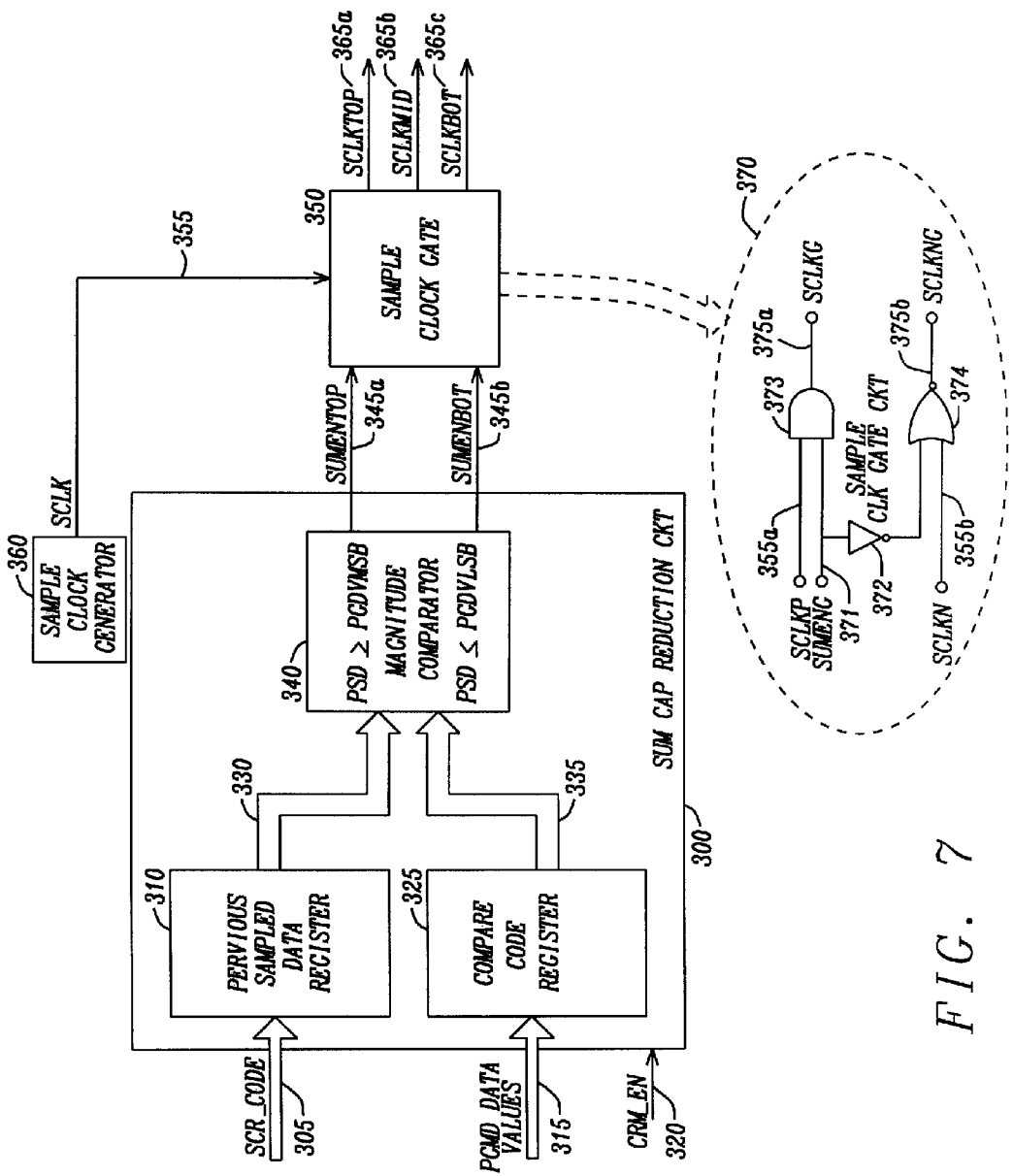
FIG. 7 is a block diagram of capacitance reduction circuitry within a delta-sigma modulated ADC embodying the principles of the present disclosure.

FIG. 7 is a block diagram of capacitance reduction circuit 300 provides an implementation of the capacitance reduction circuits 150 of FIGS. 5 and 275 of FIG. 6b within a delta-sigma modulated ADC embodying the principles of the present disclosure. The capacitance reduction circuit 300 is connected to receive the Switched Capacitance Reduction Code 305 that is applied and retained by a previous sampled data register 310. A programmed boundary data value 315 is connected to be received by the capacitance reduction circuit 300 and applied and retained by the comparison code register 325. A capacitance reduction method activation signal 320 is received by the capacitance reduction circuit 300 to activate or deactivate the capacitance reduction circuit 300.

When the capacitance reduction circuit 300 is activated, the previously sampled data 330 is retrieved from the previous sampled data register 310 and applied to the magnitude comparator 340. Similarly, the stored programmed boundary data value 335 is retrieved from the comparison code register 325 to be applied to the magnitude comparator 340. The stored programmed boundary data value 335 has two values. The first boundary data value of the stored programmed boundary data value 335 defines the boundary for the most significant bits of the thermometer code to be compared with the previously sampled data. The second boundary data value of the stored programmed boundary data value 335 defines the boundary for the least significant bits of the thermometer code to be compared with the previously sampled data. The magnitude comparator 340 performs the comparison of the previously sampled data 330 with the stored programmed boundary data value 335 according to the method as described in FIG. 4. The top switched capacitor summation circuits 207a, 207b, and 207c are enabled and the bottom switched capacitor summation circuits 211a, 211b, and 211c are disabled when the stored programmed boundary data value 335 is greater than the first boundary data value of the stored programmed boundary data value 335. The top switched capacitor summation circuits 207a, 207b, and 207c are disabled and the bottom switched capacitor summation circuits 211a, 211b, and 211c are enabled when the stored programmed boundary data value 335 is less than the second boundary data value of the stored programmed boundary data value 335.

The enable top signal 345a and enable bottom signal 345b are applied to the sample clock gating circuit 350. The sample clock generator 360 produces the sampling clocks 355 for activating the switched capacitor summation circuits 207a, 207b, and 207c, 209, and 211a, 211b, and 211c of FIG. 6a to sample the data applied to the summer function 205. The sampling clocks 355 are transferred to the sample clock gate 350 and based on the states of the enable top signal 345a and enable bottom signal 345b appropriately enable the top sampling clock 365a and disable the bottom sampling clock 365c or in the reverse, disable the top sampling clock 365a and enable the bottom sampling clock 365c. The middle sampling clock 365b is enabled at all times.

The sample clock gating circuit 350 is formed of multiple clock gating circuits 370. The sampling clock as generated by the sample clock generator 360 is in fact a differential signal having a positive clock 355a and a negative clock 355b. The enable signal 371 is applied to an AND circuit 373. The positive clock 355a is also applied to the AND circuit 373 to provide a positive gated clock 375a. The enable signal 371 is also applied to an inverter 372 to create a negated enable signal that is applied to a NOR circuit 374. The negative 355b is also applied to the NOR circuit 374 to provide a negative gated clock 375b. The positive gate clock 375a and the negative gated clock 375b are appropriately transferred to the switched capacitor summation circuits 207a, 207b, and 207c, 209, and 211a, 211b, and 211c to activate the appropriate switches as described in the method of FIG. 4.

The subtlety of the clock gating circuit 370 is to gate the input sampling clock 355a and 355b such that irrespective of when it is gated off the differential positive gate clock 375a and the negative gated clock 375b revert to their correct logic states. This ensures that neither PMOS nor NMOS transistors of the switched capacitor summation circuits 207a, 207b, and 207c, 209, and 211a, 211b, and 211c are inappropriately switched on.

Figure 8:
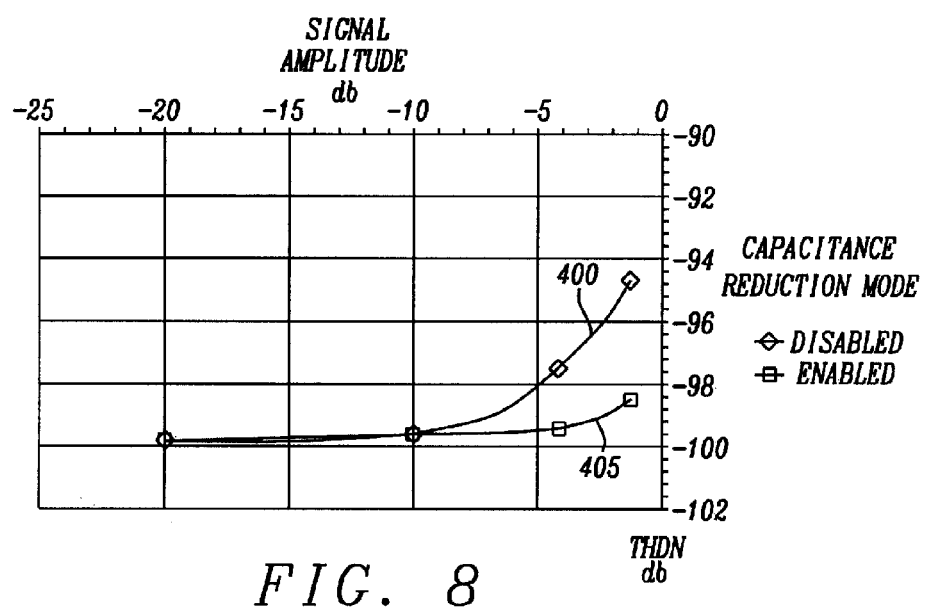
FIG. 8 is a plot comparing the total harmonic distortion and noise with the input audio signal for a delta-sigma modulated ADC with and without the capacitance reduction circuitry embodying the principles of the present disclosure.

FIG. 8 is a plot comparing the total harmonic distortion and noise with the input audio signal for a delta-sigma modulated ADC with and without the capacitance reduction circuitry embodying the principles of the present disclosure. The plot 400 illustrates the input audio signal of a delta-sigma modulated ADC without the capacitance reduction circuitry embodying the principles of the present disclosure. Alternately, the plot 405 illustrates the input audio signal of a delta-sigma modulated ADC with the capacitance reduction circuitry embodying the principles of the present disclosure. The difference between the plot 400 and the plot 405 indicates approximately a 4 db improvement of the total harmonic distortion and noise at the full-scale amplitude of the audio input signal. Further, it should be noted that the capacitance reduction circuit provides a very flat distortion profile.

In other embodiments, the capacitance reduction circuitry may be applied using other auxiliary information other than the previous sampling results about the previous state of the input signal to determine which of the summation and quantization circuits are disabled. In the embodiment as described the sampling switching is enabled or disabled as appropriate.

In various embodiments, the capacitance reduction may include folding and interpolation to allow the quantization comparators to be disabled to decrease the load capacitance of the delta-sigma modulator as connected to the summation-quantization of the delta-sigma modulated ADC. While this disclosure has been particularly shown and described with reference to the preferred embodiments thereof, it will be understood by those skilled in the art that various changes in form and details may be made without departing from the spirit and scope of the disclosure.

What is claimed is:

1. A circuit for reduction of total harmonic distortion and noise in a multiple bit oversampling data conversion apparatus with limited code transitions between digital code words representing an instantaneous analog signal level, comprising:
   a most significant code word boundary comparator for determining if a previous data conversion code is equal to or greater than a most significant code word boundary;
   a least significant code word boundary comparator for determining if a previous data conversion code is equal to or less than a least significant code word boundary; and
   a code converter enabling circuit connected for generating and transferring an enabling/disabling signal to a plurality of code converter circuits within the multiple bit data bit oversampling data conversion circuit for enabling and disabling groups of the code converter circuits to reduce a capacitance loading on a delta-sigma modulator of the multiple bit oversampling data conversion apparatus to reduce the total harmonic distortion and noise in the multiple bit oversampling data conversion apparatus;
   wherein when the most significant word boundary comparator indicates that the previous data conversion code is equal to or greater than the most significant code word boundary, the group of code converters circuits designated to represent the most significant data bits of a current data conversion code are enabled and the group of code converter circuits designated to represent the least significant data bits of a current data conversion code are disabled;
   wherein when the least significant word boundary comparator indicates that the previous data conversion code is equal to or less than the least significant code word boundary, the group of code converters circuits designated to represent the least significant data bits of a current data conversion code are enabled and the group of code converter circuits designated to represent the most significant data bits of a current data conversion code are disabled.

2. The circuit of claim 1 wherein the multiple bit oversampling data conversion apparatus is an analog to digital converter.

3. The circuit of claim 1 wherein the code converter enabling circuit is connected to a sample and hold circuit connected to each of the plurality of code converters to selectively enable or disable a phasing clock for controlling the connecting of sampling capacitors of the sample and hold circuit to the delta-sigma modulator.

4. A delta-sigma modulated analog-to-digital converter comprising:
   a capacitance reduction circuit that retains a conversion digital code of a previous sampling of an input signal of the delta-sigma modulated ADC and compares a set of least significant data bits and most significant bits of the conversion digital code to a least significant boundary code and a most significant boundary code;
   wherein when the least significant bits of the conversion digital code are less than or equal to the least significant boundary code or when the most significant bits of the conversion digital code are greater than or equal to the most significant boundary code, the capacitance reduction circuitry generates a capacitance reduction enable/disable code applied to a summation-quantization circuit that receives the input signal and a quantization error signal from a delta-sigma modulator, additively combines the input signal the quantization error, and applies combined quantizing signal to a plurality comparators within the summation-quantization circuit to generate a unary digital code representing a magnitude of the input signal;
   wherein the capacitance reduction enable/disable code gates a sampling clock of the summation quantization circuit such that those of the multiple switched capacitor summing circuits designated for the least significant data bits and the most significant data bits of the unary digital code sample the quantizing signal when enabled or do not sample the quantizing signal when disabled;
   wherein when selected switched capacitor summing circuits designated for least significant data bits and the most significant data bits of the unary digital code are not enabled, the capacitive loading of the outputs of the delta-sigma modulator and the input signal are reduced to improve the total harmonic distortion and noise.

5. The delta-sigma modulated analog-to-digital converter of claim 4 wherein the delta-sigma modulator is a discrete time delta-sigma modulator with switched capacitor sampling filters.

6. The delta-sigma modulated analog-to-digital converter of claim 4 wherein the delta-sigma modulator is a continuous time delta-sigma modulator.

7. The delta-sigma modulated analog-to-digital converter of claim 4 wherein
   wherein when the capacitance reduction circuit indicates that the previous data conversion code is equal to or greater than the most significant code word boundary, the group of switched capacitor summing circuits connected to summation-quantization circuits designated to represent the most significant data bits of a current data conversion code are enabled and the group of group of switched capacitor summing circuits connected to summation-quantization circuits designated to represent the least significant data bits of a current data conversion code are disabled;
   wherein when the capacitance reduction circuit indicates that the previous data conversion code is equal to or less than the least significant code word boundary, the group of group of switched capacitor summing circuits connected to summation-quantization circuits designated to represent the least significant data bits of a current data conversion code are enabled and the group of group of switched capacitor summing circuits connected to summation-quantization circuits designated to represent the most significant data bits of a current data conversion code are disabled.

8. A method for reduction of total harmonic distortion and noise in a multiple bit oversampling data conversion apparatus with limited code transitions between digital code words representing an instantaneous analog signal level, comprising the steps of:
   determining if a previous data conversion code is equal to or greater than a most significant code word boundary;
   determining if a previous data conversion code is equal to or less than a least significant code word boundary;
   generating and transferring an enabling/disabling signal to a plurality of code converter circuits within the multiple bit data bit oversampling data conversion circuit for enabling and disabling groups of the code converter circuits to reduce a capacitance loading on a delta-sigma modulator of the multiple bit oversampling data conversion apparatus to reduce the total harmonic distortion and noise in the multiple bit oversampling data conversion apparatus;

enabling the group of code converters circuits designated to represent the most significant data bits of a current data conversion code and disabling the group of code converter circuits designated to represent the least significant data bits of a current data conversion code, when the most significant word boundary comparator indicates that the previous data conversion code is equal to or greater than the most significant code word boundary; and enabling the group of code converters circuits designated to represent the least significant data bits of a current data conversion code and disabling the group of code converter circuits designated to represent the most significant data bits of a current data conversion code when the least significant word boundary comparator indicates that the previous data conversion code is equal to or less than the least significant code word boundary.

9. The method of claim 8 wherein the multiple bit oversampling data conversion apparatus is an analog to digital converter.

10. The method of claim 8 wherein enabling and disabling the groups of code converters comprises the steps of:
   connecting each of the code converters of the groups of code converters to a sample and hold circuit;
   selectively enabling or disabling a phasing clock for controlling the connecting of sampling capacitors of the sample and hold circuit to the delta-sigma modulator.

11. A non-transitory computer processor readable medium having stored thereon a program of instructions executable by the computer processor to perform a method for generating a physical description of an integrated circuit that when manufactured performs a method for reduction of total harmonic distortion and noise in a multiple bit oversampling data conversion apparatus with limited code transitions between digital code words representing an instantaneous analog signal level, comprising the steps of:
   determining if a previous data conversion code is equal to or greater than a most significant code word boundary;
   determining if a previous data conversion code is equal to or less than a least significant code word boundary;
   generating and transferring an enabling/disabling signal to a plurality of code converter circuits within the multiple bit data bit oversampling data conversion circuit for enabling and disabling groups of the code converter circuits to reduce a capacitance loading on a delta-sigma modulator of the multiple bit oversampling data conversion apparatus to reduce the total harmonic distortion and noise in the multiple bit oversampling data conversion apparatus;
   enabling the group of code converters circuits designated to represent the most significant data bits of a current data conversion code and disabling the group of code converter circuits designated to represent the least significant data bits of a current data conversion code, when the most significant word boundary comparator indicates that the previous data conversion code is equal to or greater than the most significant code word boundary; and
   enabling the group of code converters circuits designated to represent the least significant data bits of a current data conversion code and disabling the group of code converter circuits designated to represent the most significant data bits of a current data conversion code when the least significant word boundary comparator indicates that the previous data conversion code is equal to or less than the least significant code word boundary.

12. The non-transitory computer processor readable medium of claim 11 wherein the multiple bit oversampling data conversion apparatus is an analog to digital converter.

13. The non-transitory computer processor readable medium of claim 11 wherein enabling and disabling the groups of code converters comprises the steps of:
   connecting the each of the code converters of the groups of code converters to a sample and hold circuit;
   selectively enabling or disabling a phasing clock for controlling the connecting of sampling capacitors of the sample and hold circuit to the delta-sigma modulator.

* * * * *